(12) United States Patent
Bai (10) Patent No.: US 11,342,363 B2
(45) Date of Patent: May 24, 2022

(54) ARRAY SUBSTRATE (71) Applicant: WUHAN CHINA STAR OPTOELECTRONICS SEMICONDUCTOR DISPLAY TECHNOLOGY CO., LTD., Wuhan (CN)

(72) Inventor: Yamei Bai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 204 days.

(21) Appl. No.: 16/623,457

(22) PCT Filed: Jul. 4, 2019

(86) PCT No.: PCT/CN2019/094690
§ 371 (c)(1),
(2) Date: Dec. 17, 2019

(87) PCT Pub. No.: WO2020/232801
PCT Pub. Date: Nov. 26, 2020

(65) Prior Publication Data
US 2021/0335847 A1 Oct. 28, 2021

(30) Foreign Application Priority Data
May 17, 2019 (CN) .......................... 201910412459.5

(51) Int. Cl.
H01L 27/12 (2006.01)

(52) U.S. Cl.
CPC ...... *H01L 27/1248* (2013.01); *H01L 27/1218* (2013.01)

(58) Field of Classification Search
CPC ............. H01L 27/1248; H01L 27/1218; H01L 27/3276; H01L 27/3248; H01L 27/124; H01L 27/3258; H01L 27/1288; H01L 51/5012; H01L 27/3262; H01L 51/0097; H01L 51/0023; H01L 27/3246; H01L 27/1225; H01L 51/56; H01L 51/5253;
(Continued)

(56) References Cited

U.S. PATENT DOCUMENTS

2016/0218305 A1* 7/2016 Kim .................. G02F 1/133345
2017/0062760 A1* 3/2017 Kim .................... H01L 27/3276
(Continued)

FOREIGN PATENT DOCUMENTS

| CN | 106356380 A | 1/2017 |
| CN | 106601133 A | 4/2017 |

(Continued)

*Primary Examiner* — Mouloucoulaye Inoussa
(74) *Attorney, Agent, or Firm* — Osha Bergman Watanabe & Burton LLP (57) ABSTRACT

An array substrate is provided, which includes a flexible substrate, a driving circuit layer and at least one layer of a bending material. The driving circuit layer is disposed on a side of the flexible substrate, at least one bending material layer is disposed in the driving circuit layer. The bending performance of the array substrate is enhanced by providing at least one bending material layer in the driving circuit layer.

20 Claims, 2 Drawing Sheets (58) Field of Classification Search
CPC .... H01L 51/5206; Y02E 10/549; Y02P 70/50;
G06F 1/1652; G02F 1/133305
See application file for complete search history.

(56) References Cited

U.S. PATENT DOCUMENTS

| | | | |
|---|---|---|---|
| 2017/0125505 A1* | 5/2017 | Oh | H01L 51/52 |
| 2017/0271617 A1* | 9/2017 | Choi | H01L 51/0097 |
| 2018/0145125 A1* | 5/2018 | Lee | H01L 27/3262 |
| 2018/0301520 A1* | 10/2018 | Jin | H01L 27/3262 |
| 2018/0315809 A1* | 11/2018 | Kim | H01L 27/3276 |
| 2018/0337332 A1 | 11/2018 | Deng | |
| 2019/0035872 A1* | 1/2019 | Um | H01L 27/3246 |
| 2019/0148474 A1* | 5/2019 | Bu | H01L 27/3276 |
| | | | 257/40 |
| 2019/0164995 A1* | 5/2019 | Lee | H01L 27/3276 |
| 2019/0181198 A1* | 6/2019 | Son | H01L 27/1288 |
| 2019/0259967 A1* | 8/2019 | Yang | G06F 1/1652 |
| 2019/0326549 A1* | 10/2019 | Kokame | H01L 51/5246 |
| 2020/0111959 A1 | 4/2020 | Deng | |
| 2020/0243574 A1 | 7/2020 | Tian et al. | |

FOREIGN PATENT DOCUMENTS

| | | |
|---|---|---|
| CN | 109273503 A | 1/2019 |
| CN | 109560087 A | 4/2019 |

\* cited by examiner

ARRAY SUBSTRATE

FIELD OF INVENTION

The present application relates to a field of display technologies, and in particular, to an array substrate.

BACKGROUND OF INVENTION

With the development of display industry technology, bendable display panels have become a future trend. In order to achieve bending, an array substrate generally needs to have good bending performance, but currently, the array substrate has poor bending performance. It is difficult to meet bending requirements of the current display panel.

Therefore, current display panels have a technical problem that the array substrate has poor bending performance, and needs to be improved.

SUMMARY OF INVENTION

The present application provides an array substrate to alleviate the technical problem of poor bending performance of the existing array substrate.

To solve the above problems, the technical solution provided by the present application is as follows.

The application provides an array substrate, including a flexible substrate, a driving circuit layer disposed on a side of the flexible substrate, and at least one bending material layer disposed in the driving circuit layer.

In an array substrate of the present application, material of the at least one bending material layer is same as material of the flexible substrate.

In an array substrate of the present application, the driving circuit layer includes an active layer disposed on a side of the flexible substrate, a gate insulation layer disposed on a side of the active layer away from the flexible substrate, a gate layer disposed on a side of the gate insulation layer away from the active layer, an interlayer insulation layer disposed on a side of the gate layer away from the gate insulation layer, a source-drain layer disposed on a side of the interlayer insulation layer away the gate layer, and a planarization layer disposed on a side of the source-drain layer away from the interlayer insulation layer, at least one layer of the active layer, the gate insulation layer, the gate layer, the interlayer insulation layer, the source-drain layer, and the planarization layer is disposed with a groove, and the bending material layer is disposed in the groove.

In an array substrate of the present application, in the at least one layer provided with the groove, one groove is disposed in each layer.

In an array substrate of the present application, the groove is disposed in at least two layers of the driving circuit layer, and projections of all grooves on the flexible substrate are coincided.

In an array substrate of the present application, at least two layers of the driving circuit layer are provided with the groove, and projections of at least two grooves on the flexible substrate are not coincided.

In an array substrate of the present application, in the at least one layer provided with the groove, at least two grooves are disposed in each layer.

In an array substrate of the present application, the driving circuit layer includes an active layer disposed on a side of the flexible substrate, a gate insulation layer disposed on a side of the active layer away from the flexible substrate, a gate layer disposed on a side of the gate insulation layer away from the active layer, an interlayer insulation layer disposed on a side of the gate layer away from the gate insulation layer, a source-drain layer disposed on a side of the interlayer insulation layer away the gate layer, and a the planarization layer disposed on a side of the source-drain layer away from the interlayer insulation layer, and the bending material layer is disposed between at least two adjacent layers of the driving circuit layer.

In an array substrate of the present application, the bending material layer is disposed between the active layer and the gate insulation layer.

In an array substrate of the present application, the bending material layer is disposed between the gate insulation layer and the gate layer.

In an array substrate of the present application, the bending material layer is disposed between the gate layer and the interlayer insulation layer.

In an array substrate of the present application, the bending material layer is disposed between the interlayer insulation layer and the source-drain layer.

In an array substrate of the present application, the bending material layer is disposed between the source-drain layer and the planarization layer.

In an array substrate of the present application, the bending material layer is disposed between the gate insulation layer and the gate layer, between the gate layer and the interlayer insulation layer, between the interlayer insulation layer and the source-drain layer, and between the source-drain layer and the planarization layer.

In an array substrate of the present application, the bending material layer is disposed between the gate insulation layer and the gate layer, and between the gate layer and the interlayer insulation layer.

In an array substrate of the present application, the bending material layer is disposed between the gate insulation layer and the gate layer, and between the interlayer insulation layer and the source-drain layer.

In an array substrate of the present application, the bending material layer is disposed between the gate insulation layer and the gate layer, and between the source-drain layer and the planarization layer.

In an array substrate of the present application, the bending material layer is disposed between the gate layer and the interlayer insulation layer, and between the interlayer insulation layer and the source-drain layer.

In an array substrate of the present application, the bending material layer is disposed between the gate layer and the interlayer insulation layer, and between the source-drain layer and the planarization layer.

In an array substrate of the present application, the bending material layer is disposed between the interlayer insulation layer and the source-drain layer, and between the source-drain layer and the planarization layer.

The beneficial effect of the present application is as follows. The present application provides an array substrate including a flexible substrate, a driving circuit layer, and at least one bending material layer. The driving circuit layer disposed on a side of the flexible substrate. At least one bending material layer is disposed in the driving circuit layer. The bending performance of the array substrate is enhanced by providing at least one bending material layer in the driving circuit layer.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art can obtain the other drawings without any creative effort.

DETAILED DESCRIPTION OF EMBODIMENTS

The following description of each embodiment, with reference to the accompanying drawings, is used to exemplify specific embodiments which can be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The present application provides an array substrate to alleviate technical problems of poor bending performance of current array substrate.

Figure 1:
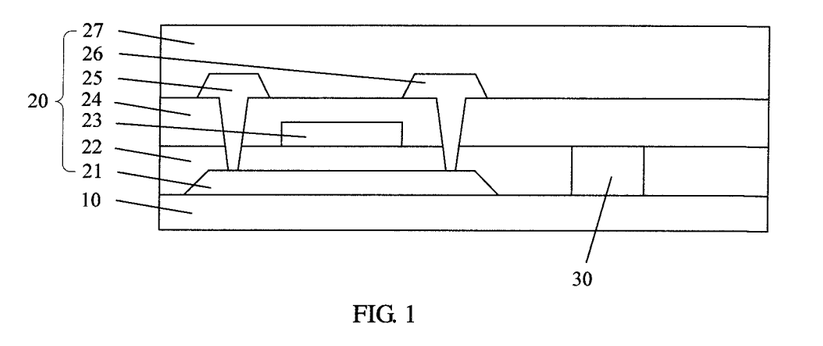
FIG. 1 is a schematic view showing a first structure of an array substrate according to an embodiment of the present application.

FIG. 1 is a schematic diagram showing a first structure of an array substrate provided by an embodiment of the present application. The array substrate includes a flexible substrate 10, a driving circuit layer 20, and at least one bending material layer 30.

A material of the flexible substrate 10 can be a flexible material commonly used in the current art for fabricating a substrate and can be, for example, at least one of polyimide, polycarbonate, and polyethylene terephthalate. Polyimide has excellent mechanical properties, its tensile strength is above 100 Mpa, and its impact strength can reach 200 KJ/m2. Polycarbonate is a tough thermoplastic resin with high strength, high modulus of elasticity, and high impact strength. Polyethylene terephthalate has good mechanical properties, the impact strength is 3 to 5 times that of other films, and good folding resistance. Therefore, any one or a combination of polyimide, polycarbonate, and polyethylene terephthalate can be used as the flexible substrate 10. It should be noted that the present application is not limited thereto, and can be other materials, such as polyurethane, polyacrylate, polyetherimide, polyethersulfone, and polyethylene naphthalate. Any material that can serve as a flexible substrate falls within the scope of protection of the present application. In the present embodiment, the flexible substrate 10 is polyimide.

The driving circuit layer 20 is disposed on one side of the flexible substrate 10 and includes a plurality of thin film transistors. The thin film transistor can be a top gate type or a bottom gate type and is a top gate type thin film transistor in this embodiment of the present application. The driving circuit layer 20 includes an active layer 21, a gate insulation layer 22, a gate layer, an interlayer insulation layer 24, a source-drain layer, and a planarization layer 27 which are stacked.

The active layer 21 is disposed on a side of the flexible substrate 10. The material of the active layer 21 can be an oxide semiconductor, an inorganic semiconductor or an organic semiconductor, etc., and can include, for example, at least one of zinc oxide (ZnOx), gallium oxide (GaOx), titanium oxide (TiOx), tin oxide (SnOx), indium oxide (InOx), indium gallium oxide (IGO), indium zinc oxide (IZO), indium tin oxide (ITO), gallium zinc oxide (GZO), zinc magnesium oxide (ZMO), zinc tin oxide (ZTO), zinc zirconium oxide (ZnZrxOy), indium gallium zinc oxide (IGZO), indium zinc tin oxide (IZTO), indium gallium oxide (IGHO), tin zinc aluminum oxide (TAZO), and indium gallium tin oxide (IGTO).

The gate insulation layer 22 is disposed on a side of the active layer 21 away from the flexible substrate 10, and the gate insulation layer 22 can include an organic material or an inorganic material.

The gate layer is disposed on a side of the gate insulation layer 22 away from the active layer 21 and is patterned to form a gate electrode 23. The material of the gate electrode 23 can be a metal, a metal alloy, a metal nitride, a conductive metal oxide, a transparent conductive material, or the like, and can include, for example, at least one of gold (Au), silver (Ag), aluminum (Al), aluminum alloy, aluminum nitride (AlNx), silver alloy, tungsten (W), tungsten nitride (WNx), copper (Cu), copper alloy, nickel (Ni), chromium (Cr), chromium nitride (CrNx), molybdenum (Mo), molybdenum alloy, titanium (Ti), titanium nitride (TiNx), platinum (Pt), tantalum (Ta), tantalum nitride (TaNx), yttrium (Nd), scandium (Sc), strontium ruthenium oxide (SRO), and zinc oxide (ZnOx).

The interlayer insulation layer 24 is disposed on aside of the gate electrode 23 away from the gate insulation layer 22. The material of the interlayer insulation layer 24 can be at least one of silicon oxide (SiOx), silicon nitride (SiNx), silicon oxynitride (SiOxNy), carbon oxide silicon (SiOxCy), silicon carbonitride (SiCxNy), hafnium oxide (HfOx), aluminum oxide (AlOx), zirconium oxide (ZrOx), titanium oxide (TiOx), and tantalum oxide (TaOx).

The source-drain layer is disposed on a side of the interlayer insulation layer 24 away from the gate electrode 23 and patterned to form a source electrode 25 and a drain electrode 26. The material of the source electrode 25 and the drain electrode 26 can be metal, alloy, metal nitride, and conductive metal oxide or transparent conductive material, for example, can be at least one of aluminum (Al), aluminum alloy, aluminum nitride (AlNx), silver (Ag), silver alloy, tungsten (W), tungsten nitride (WNx), copper (Cu), copper alloy, nickel (Ni), chromium (Cr), chromium nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx) gallium oxide (GaOx), and indium zinc oxide (IZO).

The active layer 21 includes a source region corresponding to the source electrode 25, a drain region corresponding to the drain electrode 26, and a channel region (not shown) between the source region and the drain region. In the source region, the gate insulation layer 23 and the interlayer insulation layer 24 are disposed with grooves, and the source electrode 25 is connected to the active layer 21 through the grooves. In the drain region, the gate insulation layer 23 and the interlayer insulation layer 24 are also disposed with grooves, and the drain electrode 26 is connected to the active layer 21 through the grooves.

The planarization layer 27 is disposed on a side of the source electrode 25 and the drain electrode 26 away from the interlayer insulation layer 24, and the planarization layer 27 can be an organic or inorganic material.

Within the driving circuit layer 20, at least one bending material layer 30 is disposed. The bending material layer 30 is a material which is capable of bending, stretching, and strong deformation recoveries, such as polyimide, polyurethane, and the like. The material of the bending material layer 30 can be the same as or different from the material of the flexible substrate 10.

A groove is disposed in at least one film layer of the active layer 21, the gate insulation layer 22, the gate layer, the interlayer insulation layer 24, the source-drain layer, and the planarization layer 27 is disposed with a groove, and the bending material layer 30 is disposed in the groove. That is, there are various ways in which the bending material layer 30 is disposed within the driving circuit layer 20. The groove can be disposed only in one of the film layers, that is, the bending material layer 30 can be disposed only in one film layer, or the grooves can be disposed in several film layers at the same time, that is, the bending material layer 30 is provided in several film layers at the same time. The number of grooves in each film layer can be one or more.

In the present embodiment, only one of the film layers of the driving circuit layer 20 is disposed with a groove, and in the film layer in which the groove is disposed, a groove is disposed in each film layer.

As shown in FIG. 1, a groove is disposed in the gate insulation layer 22, and no groove is disposed in the other film layers, and the bending material layer 30 is disposed in the groove of the gate insulation layer 22. A depth of the groove can be less than a thickness of the gate insulation layer 22, that is, the groove does not penetrate the gate insulation layer 22, and the bending material layer 30 is disposed on the gate insulation layer 22. The depth of the groove can also be equal to the thickness of the gate insulation layer 22, that is, the groove is disposed as a through hole, and the layer of the bending material layer 30 is disposed on the flexible substrate 10. The depth of the groove is not limited in the present application, and can be through the entire film layer or can be not penetrated, and those skilled in the art can design it according to the requirement.

In one embodiment, a groove is disposed in the active layer 21, and no groove is disposed in the other film layers, and the bending material layer 30 is disposed in the groove of the active layer 21.

In one embodiment, a groove is disposed in the gate layer, and no groove is disposed in the other layers, and the bending material layer 30 is disposed in the groove of the gate layer.

In one embodiment, a groove is disposed in the interlayer insulation layer 24, and no groove is disposed in the other film layers, and the bending material layer 30 is disposed in the groove of the interlayer insulation layer 24.

In one embodiment, a groove is disposed in the source-drain layer, and no groove is disposed in the other film layers, and the bending material layer 30 is disposed in the groove of the source-drain layer.

In one embodiment, a groove is disposed in the planarization layer 27, and no groove is disposed in the other film layers, and the bending material layer 30 is disposed in the groove of the planarization layer 27.

In a preparation process of the array substrate, a polyimide emulsion is firstly coated on a glass substrate and solidified to form a flexible substrate 10, and then a chemical vapor deposition (CVD) or a physical vapor deposition (PVD) is applied on the flexible substrate 10 for forming and patterning each film layer in the driving circuit layer 20, wherein a groove is patterned in the film layer where the bending material layer 30 is required to be disposed, and the bending material layer 30 is coated or vapor-deposited in the groove, the subsequent preparation of the film layers are disposed, and finally the glass substrate is peeled off to form an array substrate.

With the development of display industry technology, the bendable display panel has become a trend in the future. In order to achieve bending, the array substrate generally needs to have good bending performance, but the existing array substrate has poor bending performance. It is difficult to meet the bending requirements of the current display panel.

In the array substrate, the flexible substrate 10 has good flexibility, and other film layers on the flexible substrate 10 have poor bending properties. In the present application, by forming a groove in one of the film layers of the driving circuit layer 20, the bending material layer 30 is disposed in the groove so that a proportion of the bendable material in the array substrate is increased, and the bending performance of the array substrate is improved.

In one embodiment, the driving circuit layer 20 further includes a buffer layer disposed between the flexible substrate 10 and the active layer 21, and a groove can also be disposed in the buffer layer, and the bending material layer 30 is disposed in the groove.

It should be noted that the present application uses a top gate thin film transistor as an example, but is not limited thereto. For other types of thin film transistors, the bending material layer 30 can also be disposed in a corresponding film layer.

Figure 2:
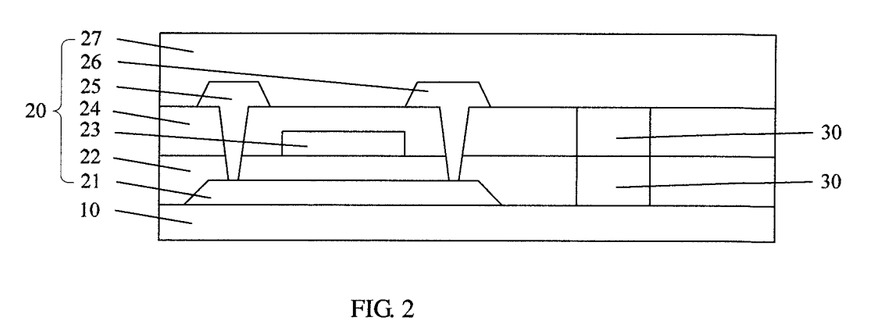
FIG. 2 is a schematic view showing a second structure of an array substrate according to an embodiment of the present application.

As shown in FIG. 2, which is a schematic diagram showing a second structure of an array substrate provided by an embodiment of the present application. The array substrate includes a flexible substrate 10, a driving circuit layer 20, and at least one bending material layer 30, wherein the driving circuit layer 20 includes an active layer 21, a gate insulation layer 22, a gate layer, an interlayer insulation layer 24, a source-drain layer, and a planarization layer 27 which are stacked.

In the present embodiment, at least two film layers in the driving circuit layer 20 are provided with grooves, and in the film layer in which the grooves are disposed, one groove is disposed on each film layer.

In FIG. 2, a groove is disposed in the gate insulation layer 22, a groove is disposed in the interlayer insulation layer 24, and no groove is disposed in the other film layers, and the bending material layer 30 is disposed on grooves of the gate insulation layer 22 and the interlayer insulation layer 24.

The projections of the two grooves on the flexible substrate 10 are coincided or are not coincided.

When the projections of the two grooves on the flexible substrate 10 have coincided, that is, the bending material layer 30 is disposed in one region of the two film layers, the bending property of the array substrate is significantly enhanced in the region. The bending or folding of the array substrate can be realized by that region.

At this time, since the gate insulation layer 22 and the interlayer insulation layer 24 forming the groove are adjacent to each other, the gate insulation layer 22 can be disposed first and patterned to form a groove, and a layer of the bending material layer 30 is disposed in the groove, and then the interlayer insulation layer is disposed and patterned to form a groove, and another layer of the bending material layer 30 is disposed in the groove. Alternatively, the gate insulation layer 22 and the interlayer insulation layer 24 can be disposed first, and then the two layers are patterned to form two grooves, the projections of the two grooves on the flexible substrate 10 are coincided, and finally a layer of the bending material layer 30 is disposed in the two grooves.

When the projections of the two grooves on the flexible substrate 10 are coincided, that is, when the bending material layer 30 is disposed in different regions of two film layers, the bending performance of an entire array substrate is enhanced, and bending of the entire array substrate can be realized.

It should be noted that FIG. 2 merely shows one of the cases in which at least two layers of a bending material layer 30 are disposed in the driving circuit layer 20. The bending material layer 30 can be disposed in any of the layers of the driving circuit layer 20, which can be or can be not adjacent, and the projections of the grooves on the plurality of layers on the flexible substrate 10 are coincided or are not coincided, and a forming manner and a forming position of the bending material layer are similar to those in the embodiments of FIG. 1 and FIG. 2, and details are not described herein again.

When all of the film layers of the driving circuit layer 20 are disposed with grooves, a number of layers of the bending material layer 30 is equal to a number of layers of the driving circuit layer 20, and the bending effect is best at this time.

The present application forms a groove in at least two layers of the active layer 21, the gate insulation layer 22, the gate layer, the interlayer insulation layer 24, the source-drain layer, and the planarization layer 27, and forms a bending material layer 30 in the groove, so as to increase the proportion of bendable material in the array substrate and to improve the bending performance of the array substrate.

Figure 3:
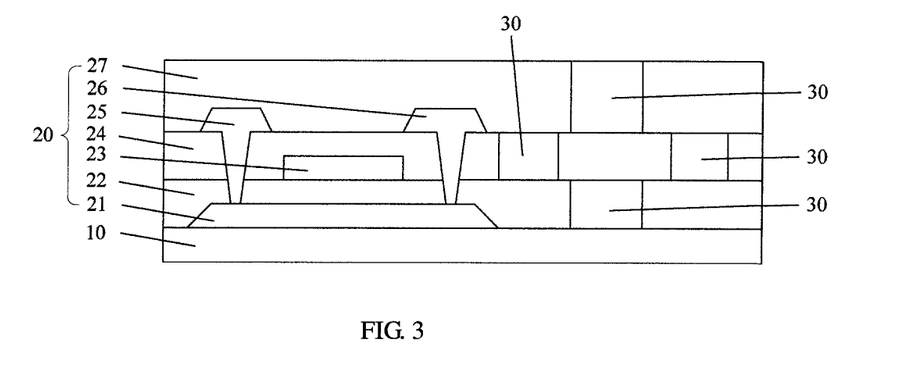
FIG. 3 is a schematic view showing a third structure of an array substrate according to an embodiment of the present application.

As shown in FIG. 3, which is a schematic view showing a third structure of an array substrate provided by an embodiment of the present application. The array substrate includes a flexible substrate 10, a driving circuit layer 20, and at least one bending material layer 30, wherein the driving circuit layer 20 includes an active layer 21, a gate insulation layer 22, a gate layer, an interlayer insulation layer 24, a source-drain layer, and a planarization layer 27 which are stacked.

Figure 4:
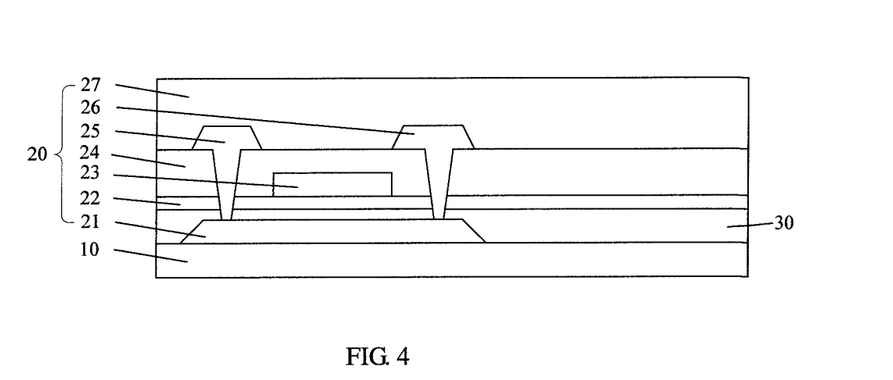
FIG. 4 is a schematic view showing a fourth structure of an array substrate according to an embodiment of the present application.

A groove is disposed in at least one of the film layers of the driving circuit layer 20, and at least one of the film layers disposed with the groove is disposed with at least two grooves. In one embodiment, as shown in FIG. 4, a groove is disposed in the gate insulation layer 22, and a bending material layer 30 is disposed in the groove. Two grooves are disposed in the interlayer insulation layer 24, and a bending material layer 30 is disposed in the two grooves. A groove is disposed in the planarization layer 27, and a bending material layer 30 is disposed in the groove.

In the present embodiment, only one of the film layers of the driving circuit layer 20 is disposed with the groove, and a bending material layer 30 is provided in the groove. Alternatively, two or three of the film layers of the driving circuit layer 20 are disposed with the grooves, in which the film layers are disposed with the grooves, at least two grooves are disposed in at least one of the film layers, wherein the bending material layer 30 is disposed in different regions of the array substrate, the bending performance of an entire array substrate is enhanced, and bending of the entire array substrate can be realized.

The present application forms a groove in at least one film layer of the driving circuit layer 20, and at least one of the film layers is disposed with at least two grooves disposed in the film layer, and a bending material layer 30 is disposed in the groove, the proportion of the bendable material in the array substrate is increased, and the bending performance of the array substrate is improved.

In FIGS. 1 to 3, the bending material layer 30 is filled in the groove by forming a groove in at least one of the film layers of the driving circuit layer 20, thereby improving the bending performance of the array substrate. It is also possible to improve the bending performance of the array substrate by forming the bending material layer 30 between at least two adjacent film layers of the driving circuit layer 20.

As shown in FIG. 4, which is a schematic view showing a fourth structure of an array substrate provided by an embodiment of the present application. The array substrate includes a flexible substrate 10, a driving circuit layer 20, and at least one bending material layer 30, wherein the driving circuit layer 20 includes an active layer 21, a gate insulation layer 22, a gate layer, an interlayer insulation layer 24, a source-drain layer, and a planarization layer 27 which are stacked.

In the present embodiment, a bending material layer 30 is disposed in the driving circuit layer 20.

Figure 5:
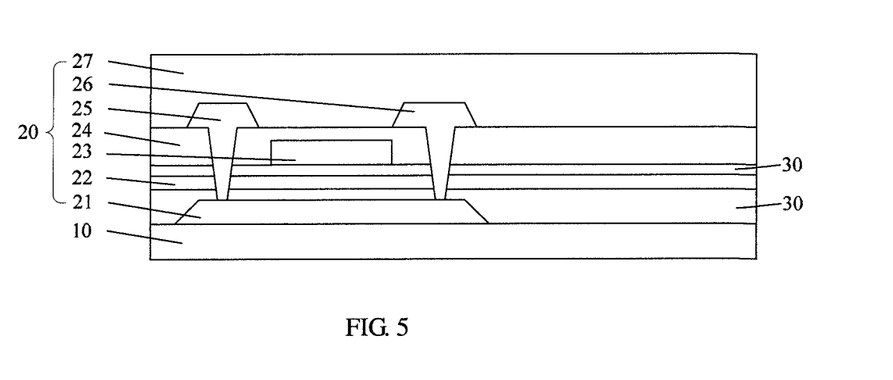
FIG. 5 is a schematic view showing a fifth structure of an array substrate according to an embodiment of the present application.

In one embodiment, as shown in FIG. 5, a bending material layer 30 is disposed between the active layer 21 and the gate insulation layer 22, and the bending material layer 30 is not disposed between the other layers.

In one embodiment, a bending material layer 30 is disposed between the gate insulation layer 22 and the gate layer, and the bending material layer 30 is not disposed between the other layers.

In one embodiment, a bending material layer 30 is disposed between the gate layer and the interlayer insulation layer 24, and the bending material layer 30 is not disposed between the other layers.

In one embodiment, a bending material layer 30 is disposed between the interlayer insulation layer 24 and the source-drain layer, and the bending material layer 30 is not disposed between the other layers.

In one embodiment, a bending material layer 30 is disposed between the source-drain layer and the planarization layer 27, and the bending material layer 30 is not disposed between the other layers.

It should be noted that, for the bending material layer 30 disposed between the two film layers, when a via hole is disposed in the film layers, the bending material layer 30 also needs to be provided in a region where the via hole is positioned correspondingly, to ensure that traces in the driving circuit layer 20 are normal.

In a preparation process of the array substrate, a polyimide emulsion is firstly coated on the glass substrate and solidified to form a flexible substrate 10, and then a chemical vapor deposition (CVD) or a physical vapor deposition (PVD) is applied on the flexible substrate 10 to form each of the film layers of the driving circuit layer 20, wherein after a certain film layer of the driving circuit layer 20 is completed, a layer of the bending material 30 is coated or vapor-deposited or deposited, then the subsequent preparation of the film layers are disposed, and finally the glass substrate is peeled off to form an array substrate.

In the present application, the bending material layer 30 is disposed between any two adjacent film layers of the driving circuit layer 20, that is, the bending material layer 30 is laid in the entire layer of the array substrate, so that the bending performance of the entire array substrate is enhanced, and bending of the entire array substrate is realized.

As shown in FIG. 5, it is a schematic view showing a fifth structure of an array substrate provided by an embodiment of the present application. The array substrate includes a flexible substrate 10, a driving circuit layer 20, and at least one bending material layer 30, wherein the driving circuit layer 20 includes an active layer 21, a gate insulation layer 22, a gate layer, an interlayer insulation layer 24, a source-drain layer, and a planarization layer 27 which are stacked.

In the present embodiment, at least two layers of the bending material layer 30 are disposed in the driving circuit layer 20. In the driving circuit layer 20, the bending material layer 30 can be disposed between any two adjacent film layers, and more the bending material layer 30 can be disposed. Those skilled in the art can set the position of the bending material layer 30 in the driving circuit layer 20 and a number of layers of the bending material layer 30 according to the requirement.

When two layers of the bending material layer 30 are disposed in the driving circuit layer 20, in one embodiment, as shown in FIG. 6, a bending material layer 30 is disposed between the active layer 21 and the gate insulation layer 22, and a bending material layer 30 is also disposed between the gate insulation layer 22 and the gate layer, and the bending material layer 30 is not disposed between the other film layers.

In one embodiment, a bending material layer 30 is disposed between the active layer 21 and the gate insulation layer 22, and a bending material layer 30 is also disposed between the gate layer and the interlayer insulation layer 24, and the bending material layer 30 is not disposed between the other film layers.

In one embodiment, a bending material layer 30 is disposed between the active layer 21 and the gate insulation layer 22, and a bending material layer 30 is also disposed between the interlayer insulation layer 24 and the source-drain layer, and the bending material layer 30 is not disposed between the other film layers.

In one embodiment, a bending material layer 30 is disposed between the active layer 21 and the gate insulation layer 22, and a bending material layer 30 is also disposed between the source-drain layer and the planarization layer 27, and the bending material layer 30 is not disposed between the other film layers.

In one embodiment, a bending material layer 30 is disposed between the gate insulation layer 22 and the gate layer, and a bending material layer 30 is also disposed between the gate layer and the interlayer insulation layer 24, and the bending material layer 30 is not disposed between the other film layers.

In one embodiment, a bending material layer 30 is disposed between the gate insulation layer 22 and the gate layer, and a bending material layer 30 is also disposed between the interlayer insulation layer 24 and the source-drain layer, and the bending material layer 30 is not disposed between the other film layers.

In one embodiment, a bending material layer 30 is disposed between the gate insulation layer 22 and the gate layer, and a bending material layer 30 is also disposed between the source-drain layer and the planarization layer 27, and the bending material layer 30 is not disposed between the other film layers.

In one embodiment, a bending material layer 30 is disposed between the gate layer and the interlayer insulation layer 24, and a bending material layer 30 is also disposed between the interlayer insulation layer 24 and the source-drain layer, and the bending material layer 30 is not disposed between the other film layers.

In one embodiment, a bending material layer 30 is disposed between the gate layer and the interlayer insulation layer 24, and a bending material layer 30 is also disposed between the source-drain layer and the planarization layer 27, and the bending material layer 30 is not disposed between the other film layers.

In one embodiment, a bending material layer 30 is disposed between the interlayer insulation layer 24 and the source-drain layer, and a bending material layer 30 is also disposed between the source-drain layer and the planarization layer 27, and the bending material layer 30 is not disposed between the other film layers.

When three layers of a bending material layer 30 are disposed in the driving circuit layer 20, in one embodiment, a bending material layer 30 is disposed between the active layer 21 and the gate insulation layer 22, between the gate insulation layer 22 and the gate layer, and between the gate layer and the interlayer insulation layer 24, and the bending material layer 30 is not disposed between the other film layers.

In one embodiment, a bending material is disposed between the active layer 21 and the gate insulation layer 22, between the gate insulation layer 22 and the gate layer, and between the interlayer insulation layer 24 and the source-drain layer, and the bending material layer 30 is not disposed between the other film layers.

In one embodiment, a bending material layer 30 is disposed between the active layer 21 and the gate insulation layer 22, between the gate insulation layer 22 and the gate layer, and between the source-drain layer and the planarization layer 27, and the bending material layer 30 is not disposed between the other film layers.

In one embodiment, a bending material layer is disposed between the active layer 21 and the gate insulation layer 22, between the gate layer and the interlayer insulation layer 24, and between the interlayer insulation layer 24 and the source-drain layer, and the bending material layer 30 is not disposed between the other film layers.

In one embodiment, a bending material is disposed between the active layer 21 and the gate insulation layer 22, between the gate layer and the interlayer insulation layer 24, and between the source-drain layer and the planarization layer 27, and the bending material layer 30 is not disposed between the other film layers.

In one embodiment, a bending material layer is disposed between the active layer 21 and the gate insulation layer 22, between the interlayer insulation layer 24 and the source-drain layer, and between the source-drain layer and the planarization layer 27, and the bending material layer 30 is not disposed between the other film layers.

In one embodiment, a bending material is disposed between the gate insulation layer 22 and the gate layer, between the gate layer and the interlayer insulation layer 24, and between the interlayer insulation layer 24 and the source-drain layer, and the bending material layer 30 is not disposed between the other film layers.

In one embodiment, a bending material layer 30 is disposed between the gate insulation layer 22 and the gate layer, between the gate layer and the interlayer insulation layer 24, and between the source-drain layer and the planarization layer 27, and the bending material layer 30 is not disposed between the other film layers.

In one embodiment, a bending material is disposed between the gate layer and the interlayer insulation layer 24, between the interlayer insulation layer 24 and the source-drain layer, and between the source-drain layer and the planarization layer 27, and the bending material layer 30 is not disposed between the other film layers.

When four layers of a bending material layer 30 are disposed in the driving circuit layer 20, in one embodiment, a bending material layer 30 is disposed between the active layer 21 and the gate insulation layer 22, between the gate insulation layer 22 and the gate layer, the gate layer and the interlayer insulation layer 24, and between the interlayer insulation layer 24 and the source-drain layer, and the bending material layer 30 is not disposed between the other film layers.

In one embodiment, a bending material layer 30 is disposed between the active layer 21 and the gate insulation layer 22, between the gate insulation layer 22 and the gate layer, between the gate layer and the interlayer insulation layer 24, and between the source-drain layer and planarization between layers 27, and the bending material layer 30 is not disposed between the other film layers.

In one embodiment, a bending material layer 30 is disposed between the gate insulation layer 22 and the gate layer, between the gate layer and the interlayer insulation layer 24, between the interlayer insulation layer 24 and the source-drain layer, and between the source-drain layer and the planarization layer 27, and the bending material layer 30 is not disposed between the other film layers.

When five layers of a bending material layer 30 are disposed in the driving circuit layer 20, a bending material layer 30 is disposed between the active layer 21 and the gate insulation layer 22, between the gate insulation layer 22 and the gate layer, between the gate layer and the interlayer insulation layer 24, between the interlayer insulation layer 24 and the source-drain layer, and between the source-drain layer and the planarization layer 27.

It should be noted that, for the bending material layer 30 disposed between the two film layers, when a via hole is disposed in the film layers, the bending material layer 30 also needs to be provided in a region where the via hole is positioned correspondingly, to ensure that traces in the driving circuit layer 20 are normal.

In the present application, the bending material layer 30 is disposed between any two adjacent film layers of the driving circuit layer 20, that is, the bending material layer 30 is laid in the entire layer of the array substrate, so that the bending performance of the entire array substrate is enhanced, and bending of the entire array substrate is realized.

According to the above embodiment, it can be known that:

The present application provides an array substrate including a flexible substrate, a driving circuit layer and at least one layer of a bending material, the driving circuit layer being disposed on a side of the flexible substrate, at least one bending material layer being disposed in the driving circuit layer. The bending performance of the array substrate is enhanced by providing at least one bending material layer in the driving circuit layer.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising:
   a flexible substrate;
   a driving circuit layer disposed on a side of the flexible substrate; and
   a plurality of bending material layers disposed in the driving circuit layer,
   wherein two of the plurality of bending material layers are spaced apart from each other and have orthographic projections on the flexible substrate overlapped with each other.

2. The array substrate according to claim 1, wherein material of the plurality of bending material layers are same as material of the flexible substrate.

3. The array substrate according to claim 1, wherein the driving circuit layer comprises an active layer disposed on a side of the flexible substrate, a gate insulation layer disposed on a side of the active layer away from the flexible substrate, a gate layer disposed on a side of the gate insulation layer away from the active layer, an interlayer insulation layer disposed on a side of the gate layer away from the gate insulation layer, a source-drain layer disposed on a side of the interlayer insulation layer away the gate layer, and a planarization layer disposed on a side of the source-drain layer away from the interlayer insulation layer, at least one layer of the active layer, the gate insulation layer, the gate layer, the interlayer insulation layer, the source-drain layer, and the planarization layer is disposed with a groove, and each of the plurality of bending material layers is disposed in the groove.

4. The array substrate according to claim 3, wherein in the at least one of the active layer, the gate insulation layer, the gate layer, the interlayer insulation layer, the source-drain layer, and the planarization layer provided with the groove, one groove is disposed in one of the active layer, the gate insulation layer, the gate layer, the interlayer insulation layer, the source-drain layer, and the planarization layer.

5. The array substrate according to claim 4, wherein the groove is disposed in at least two layers of the driving circuit layer, and projections of all grooves on the flexible substrate are coincided.

6. The array substrate according to claim 4, wherein at least two layers of the driving circuit layer are provided with the groove, and projections of at least two grooves on the flexible substrate are not coincided.

7. The array substrate according to claim 3, wherein in the at least one of the active layer, the gate insulation layer, the gate layer, the interlayer insulation layer, the source-drain layer, and the planarization layer provided with the groove, at least two grooves are disposed in one of the active layer, the gate insulation layer, the gate layer, the interlayer insulation layer, the source-drain layer, and the planarization layer.

8. The array substrate according to claim 1, wherein the driving circuit layer comprises an active layer disposed on a side of the flexible substrate, a gate insulation layer disposed on a side of the active layer away from the flexible substrate, a gate layer disposed on a side of the gate insulation layer away from the active layer, an interlayer insulation layer disposed on a side of the gate layer away from the gate insulation layer, a source-drain layer disposed on a side of the interlayer insulation layer away the gate layer, and a the planarization layer disposed on a side of the source-drain layer away from the interlayer insulation layer, and one of the plurality of bending material layers is disposed between at least two adjacent layers of the driving circuit layer.

9. The array substrate according to claim 8, wherein one of the plurality of bending material layers is disposed between the active layer and the gate insulation layer.

10. The array substrate according to claim 8, wherein one of the plurality of bending material layers is disposed between the gate insulation layer and the gate layer.

11. The array substrate according to claim 8, wherein one of the plurality of bending material layers is disposed between the gate layer and the interlayer insulation layer.

12. The array substrate according to claim 8, wherein one of the plurality of bending material layers disposed between the interlayer insulation layer and the source-drain layer.

13. The array substrate according to claim 8, wherein one of the plurality of bending material layers is disposed between the source-drain layer and the planarization layer.

14. The array substrate according to claim 8, wherein the plurality of bending material layers are disposed between the gate insulation layer and the gate layer, between the gate layer and the interlayer insulation layer, between the interlayer insulation layer and the source-drain layer, and between the source-drain layer and the planarization layer.

15. The array substrate according to claim 8, wherein the plurality of bending material layers are disposed between the gate insulation layer and the gate layer, and between the gate layer and the interlayer insulation layer.

16. The array substrate according to claim 8, wherein the plurality of bending material layers are disposed between the gate insulation layer and the gate layer, and between the interlayer insulation layer and the source-drain layer.

17. The array substrate according to claim 8, wherein the plurality of bending material layers are disposed between the gate insulation layer and the gate layer, and between the source-drain layer and the planarization layer.

18. The array substrate according to claim 8, wherein the plurality of bending material layers are disposed between the gate layer and the interlayer insulation layer, and between the interlayer insulation layer and the source-drain layer.

19. The array substrate according to claim 8, wherein the plurality of bending material layers are disposed between the gate layer and the interlayer insulation layer, and between the source-drain layer and the planarization layer.

20. The array substrate according to claim 8, wherein the plurality of bending material layers are disposed between the interlayer insulation layer and the source-drain layer, and between the source-drain layer and the planarization layer.

* * * * *